United States Patent [19]
Becker et al.

[11] Patent Number: 5,858,603
[45] Date of Patent: Jan. 12, 1999

[54] SUPPORT MATERIAL FOR MAKING COLOR TEST PRINTS IN THE ANALOG PROOF SYSTEM

[76] Inventors: Dieter Becker, Schultenhof 7, 49124 Georgsmarienhütte; Jürgen Graumann, Hammerweg 10, 49090 Osnabrück, both of Germany

[21] Appl. No.: 967,280

[22] Filed: Nov. 7, 1997

Related U.S. Application Data

[63] Continuation of Ser. No. 643,416, May 8, 1996, abandoned.

[30] Foreign Application Priority Data

May 10, 1995 [DE] Germany ............... 195 17 040.7

[51] Int. Cl.$^6$ ........................................... G03C 1/76
[52] U.S. Cl. ................................ 430/138; 430/293
[58] Field of Search ........................ 430/138, 293

[56] References Cited

U.S. PATENT DOCUMENTS

| | | | |
|---|---|---|---|
| 4,111,667 | 9/1978 | Adams | 51/295 |
| 4,579,810 | 4/1986 | Johnson et al. | 430/293 |
| 4,929,590 | 5/1990 | Maruta et al. | 503/207 |
| 5,100,728 | 3/1992 | Plamthottam et al. | 428/345 |
| 5,393,726 | 2/1995 | Graumann | 503/227 |

FOREIGN PATENT DOCUMENTS

| | | |
|---|---|---|
| 243932 | 11/1987 | European Pat. Off. . |
| 305599 | 3/1989 | European Pat. Off. . |
| 590322 | 4/1994 | European Pat. Off. . |
| 622681 | 11/1994 | European Pat. Off. . |

*Primary Examiner*—Hoa Van Le
*Attorney, Agent, or Firm*—Lockwood, Alex, Fitz-Gibbon & Cummings

[57] ABSTRACT

A support material for making color test prints in the analog proof system, in which the support material has a layer comprising a hydrophobic binder or binder mixture and a pigment mixture containing hollow micro-balls.

28 Claims, No Drawings

SUPPORT MATERIAL FOR MAKING COLOR TEST PRINTS IN THE ANALOG PROOF SYSTEM

This application is a continuation of application Ser. No. 08/643,416, filed May 8, 1996, now abandoned.

DESCRIPTION

The present invention relates to a support material for making color test prints in the so-called analog proof system.

A series of production stages are involved in the manufacture of printed products. The proof represents an important stage, which—with prescribed preparation—provides an accurate representation of the attainable print results before beginning printing. The proof provides the possibility of introducing desirable alterations before beginning to print, which can enter into the reproduction and thus lead to the desired end product.

In order to make the proof preparation economical, proof systems have been developed, which must be capable of simulating the later print run.

The various available analog-based proof systems differ first and foremost in the chemical system and the preparation process associated therewith. The diazo method for image creation requiring a wet chemical development step and the dry photo-polymer systems have become widely used.

The "Cromalin" method for example pertains to the dry proof systems. This involves a lamination method with dry toner application. An adhesive monomer layer applied to a support material is polymerized when coated through a color separation layer at the places affected by light and loses its adhesiveness at these places. The dry toner is taken up at the remaining adhesive places. This operation is repeated with the remaining colors, until the complete image results.

Normally polyethylene coated paper or paper coated with aqueous resin solution is used as the support material for test prints, such as the so-called "Kromkote" paper for example.

The visual image impression is affected more strongly by the so-called tonal value increase than by the color value. The tonal value increase arises from the growth in the raster point size.

In printing the dot gain is preeminently of a geometrical nature. In the printing process, the printing ink is transferred to the paper via a rubber blanket. In this process, the raster point is as a rule squashed out more or less wider.

In the laminate test prints the tone value is based on an optical effect (light gathering). The effect results from scattering of the incident light in the printing medium in a border zone around the raster point.

In a visual comparison the tonal value increases measured in the middle tonal range lie clearly higher in the proof image than in a print. The image appears more saturated than it really is.

In simulating the printing results with the aid of a proof print it is therefore important to match the overall dot gain of the proof image to the overall dot gain of the printing copy, i.e. to reduce the optical dot gain.

In U.S. Pat. No. 4,579,810 the reduction of the dot gain can be achieved by a certain glossiness of the support material. However, it is a disadvantage that the photo-polymerizable layers to be applied thereto and also affecting the point size have to be applied very thinly, which is difficult to realize.

The dot gain is reduced in EP 0 243 932 A1 by the addition of di(meth)acrylate to the photo-polymerizable layers applied to a coated paper.

A further attempt to reduce the optical dot gain is described in EP 0 305 599 A1. To achieve the object a base paper coated with a $TiO_2$ dispersion is used. However, it is a disadvantage that the applied weight of the light sensitive layers to be applied to the support must be very small.

Accordingly, the object of the present invention is to provide a support material for making color test prints in the analog proof system, with the aid of which it is possible to achieve a reduction in the optical dot gain.

This object is met by a support material which comprises a support and a layer disposed thereon consisting of a hydrophobic binder or binder mixture and a pigment mixture containing hollow micro-balls.

A suitable support is a raw paper, coated paper, resin coated paper or a plastics layer. However a base paper with a weight per unit area of 80 to 250 $g/m^2$ coated on one or both sides with polyethylene is particularly suitable. The base paper can be coated with low density polyethylene (LDPE) or high density polyethylene (HDPE) or a mixture of the two types of polyethylene. In one particular embodiment of the invention the front side and rear side polyethylene coatings comprise 10 to 70% by weight HDPE. The amount of the polyethylene coating which is applied lies in the range from 15 to 50 $g/m^2$.

The layer according to the invention can contain hydrophobic binders such as an acrylic acid ester, polyvinylacetate, vinylchloride/vinylacetate copolymer, polystyrene, polyurethane, polyvinylchloride, polyvinylidenechloride, styrene/butadiene copolymer, styrenated acrylic acid ester, or a mixture of these binders.

Binders comprising of vinylchloride/vinylacetate copolymers or of styrenated acrylic acid ester are particularly preferred.

The binder in the layer amounts to 15 to 95% by weight, preferably 20 to 80% by weight, more preferably 20 to 50% by weight, referred to the dry layer.

A further component of the layer according to the invention is a pigment mixture which comprises hollow microparticles or micro-balls. Hollow micro-balls based on polystyrene/acrylate and styrene or acrylic resin basis are particularly preferred. The micro-ball content in the pigment mixture is in the range 10 to 80% by weight, and preferably however 30 to 70% by weight.

The hollow micro-balls have a diameter of 0.4 to 1 $\mu m$. Micro-balls with a diameter of 0.5 to 1 $\mu m$ are particularly good.

The pigment mixture can contain inorganic pigments, such as $TiO_2$, $CaCO_3$, ZnO, ZnS, $ZnSO_4$, $Sb_2O_3$, $CaSO_4$, $BaSO_4$, kaolin, talcum or mixtures thereof. A pigment mixture of $TiO_2$ and hollow polystyrene/acrylate micro-balls is especially preferred, in which the ratio of amounts is $TiO_2$/micro-balls 3:7 to 7:3.

In a further embodiment of the invention a pigment mixture is used with $TiO_2$, $CaCO_3$ and hollow micro-balls, wherein the $CaCO_3$ content in the mixture can amount to up to 70% by weight.

The amount of $TiO_2$ in the pigment mixture is in the range from 10 to 80% by weight, preferably 30 to 70% by weight.

The total pigment content in the layer amounts to 5 to 85% by weight, and preferably 50 to 80% by weight.

The layer according to the invention is applied to the support in an aqueous dispersion. This can be effected with all customary application systems. The amount of the coating is so selected that, after the drying, the weight of application is from 4 to 20 $g/m^2$, and preferably 8 to 12 $g/m^2$.

The following examples will further explain the invention.

EXAMPLES 1–6

A base paper of 180 g/m² weight per unit area which has been coated on the front side with 30 g/m² polyethylene (40% HDPE, 60% LDPE) which contains 10% by weight titanium dioxide and on the rear side with 30 g/m² polyethylene (40% HDPE, 60% LDPE), is subjected on the front side to a corona discharge and is then provided with the layers composed in accordance with Table 1. The layers are applied in an aqueous dispersion. The applied coatings are dried in a hot air tunnel to the applied weights set out in Table 1.

TABLE 1

| | Composition, % by weight | | | | | | |
|---|---|---|---|---|---|---|---|
| Components | 1 | 2 | 3 | 4 | 5 | 6 | 7 |
| Styrenated acrylate (Primal ® P-376 Lo) | 40 | 50 | 20 | 20 | 20 | — | 20 |
| Vinylchloride/vinylacetate copol. (Vinol ® 50/25 C) | — | — | — | — | — | 20 | — |
| TiO₂ (RN 40, Kronos company) | 40 | 15 | 24 | 35 | 50 | 35 | 35 |
| CaCO₃ (Hydrocarb ® 60) | — | — | 16 | — | — | — | — |
| Hollow micro-balls of styrene/acrylate copol., φ 0.4 μm (Ropaque ® OP 90) | 20 | 35 | 40 | 45 | 30 | 45 | — |
| Hollow micro-balls of styrene/acrylate copol., φ 1 μm (Ropaque ® HP-91) | — | — | — | — | — | — | 45 |
| Applied weight, g/m² (dry) | 8 | 8 | 8 | 12 | 12 | 8 | 12 |

Comparative Examples V1–V4

A polyethylene coated base paper as in examples 1–6 was provided with the following layers on the front side:

TABLE 2

| | Composition, % by weight | | | |
|---|---|---|---|---|
| Components | V1 | V2 | V3 | V4 |
| Styrenated acrylate (Primal ® P-376 Lo) | 20 | 50 | 20 | 20 |
| TiO₂ (RN 40, Kronos company) | 80 | 50 | — | — |
| CaCO₃ (Hydrocarb ® 60) | — | — | 80 | — |
| Hollow micro-balls of styrene/acrylate copol., (Ropaque ® OP 90) | — | — | — | 80 |
| Applied weight, g/m² (dry) | 10 | 8 | 8 | 10 |

Comparative Example V5

A polyethylene coated paper as in examples 1–6 was used directly as support material for making test prints.

Making Test Prints and Determination of the Dot Gain

The support papers made in accordance with the examples and comparative examples were used to make test prints by the Hoechst "Pressmatch Dry" proofing method and the Dupont "Cromalin" proofing method. Both proofing methods are lamination methods.

In the "Cromalin" method a film coated with UV-sensitive monomer is laminated onto the support paper. The material provided with the monomer film is exposed in contact with a color separation film. The monomer polymerizes at the light exposed p laces and thus loses its adhesiveness. Toner particles deposit on the remaining sticky parts in a further process step. This mode of operation is repeated for the remaining colors.

In the "Pressmatch Dry" method the pigments are embedded in light sensitive layers. These are laminated onto the support paper, exposed and stripped off.

The exposure was effected with a test element, the UGRA test wedge 1982 for the colors cyan, magenta, yellow and black. Fields are present on the test wedge which have area coverages of 100 to 10% at 10% intervals.

The color densities were measured in the test fields with a densitometer (Gretag D 186) for the color area coverages of 40% and 80%.

The dot gain was then calulated by the Murray-Davis formula. These values are set out in Tables 3 and 4.

It can be seen from the Tables 3 and 4 that all supported materials in accordance with the invention give a lower optical dot gain. This is especially noticeable in comparison with the standard material (V5).

TABLE 3

Test results ("Pressmatch Dry" proofing method)

Dot gain, %

| | Area coverage 40% | | | | | Area coverage 80% | | | | |
|---|---|---|---|---|---|---|---|---|---|---|
| Example | Cyan | Magenta | Yellow | Black | Average value | Cyan | Magenta | Yellow | Black | Average value |
| 1 | 17.3 | 18.3 | 19.3 | 20.0 | 18.7 | 9.2 | 10.3 | 10.5 | 11.0 | 10.3 |
| 2 | 17.5 | 18.3 | 19.5 | 20.5 | 19.0 | 9.3 | 10.5 | 10.5 | 11.0 | 10.3 |
| 3 | 17.0 | 18.0 | 19.0 | 20.0 | 18.5 | 9.0 | 10.0 | 10.0 | 11.0 | 10.0 |
| 4 | 16.0 | 18.0 | 19.0 | 19.0 | 17.8 | 9.0 | 10.0 | 10.0 | 10.0 | 9.8 |
| 5 | 16.3 | 18.0 | 19.3 | 19.0 | 18.0 | 9.3 | 10.0 | 10.3 | 10.0 | 10.0 |

TABLE 3-continued

Test results ("Pressmatch Dry" proofing method)

Dot gain, %

| | Area coverage 40% | | | | | Area coverage 80% | | | | |
|---|---|---|---|---|---|---|---|---|---|---|
| Example | Cyan | Magenta | Yellow | Black | Average value | Cyan | Magenta | Yellow | Black | Average value |
| 6 | 16.0 | 18.0 | 18.0 | 19.0 | 17.8 | 9.0 | 10.0 | 10.0 | 10.0 | 9.8 |
| 7 | 15.0 | 17.0 | 18.0 | 19.0 | 17.3 | 8.6 | 9.7 | 9.8 | 10.0 | 9.5 |
| V1 | 21.0 | 20.0 | 19.0 | 20.0 | 20.0 | 12.0 | 11.0 | 10.0 | 11.0 | 11.0 |
| V2 | 20.0 | 20.0 | 20.0 | 20.0 | 20.0 | 10.0 | 11.0 | 10.0 | 12.0 | 10.8 |
| V3 | 20.0 | 21.0 | 21.0 | 23.0 | 21.3 | 11.0 | 11.0 | 11.0 | 12.0 | 11.3 |
| V4 | 19.0 | 22.0 | 21.0 | 21.0 | 20.8 | 10.0 | 12.0 | 11.0 | 11.0 | 11.0 |
| V5 | 23.0 | 23.0 | 21.0 | 22.0 | 22.3 | 12.0 | 12.0 | 12.0 | 12.0 | 12.0 |

TABLE 4

Test results ("Cromalin" proofing method)

Dot gain, %

| | Area coverage 40% | | | | | Area coverage 80% | | | | |
|---|---|---|---|---|---|---|---|---|---|---|
| Example | Cyan | Magenta | Yellow | Black | Average value | Cyan | Magenta | Yellow | Black | Average value |
| 1 | 21.3 | 21.2 | 22.2 | 21.0 | 21.4 | 11.0 | 10.3 | 11.3 | 11.3 | 11.0 |
| 2 | 21.0 | 21.3 | 22.0 | 21.2 | 21.4 | 11.3 | 10.5 | 11.5 | 11.3 | 11.2 |
| 3 | 21.0 | 21.3 | 22.0 | 21.0 | 21.3 | 11.0 | 10.3 | 11.0 | 11.3 | 10.9 |
| 4 | 21.0 | 21.2 | 21.7 | 19.0 | 20.7 | 11.0 | 10.2 | 11.0 | 11.0 | 10.8 |
| 5 | 21.2 | 21.2 | 21.8 | 19.0 | 20.8 | 11.3 | 10.2 | 11.0 | 11.0 | 10.9 |
| 6 | 21.0 | 22.0 | 21.6 | 19.0 | 20.9 | 11.0 | 10.2 | 11.0 | 11.2 | 10.9 |
| 7 | 20.5 | 19.9 | 20.3 | 19.0 | 19.9 | 10.7 | 10.0 | 10.7 | 11.0 | 10.6 |
| V1 | 21.3 | 22.3 | 23.2 | 21.0 | 22.0 | 11.3 | 11.0 | 11.4 | 12.0 | 11.4 |
| V2 | 21.5 | 22.5 | 23.5 | 22.0 | 22.4 | 11.0 | 11.0 | 11.0 | 11.8 | 11.2 |
| V3 | 23.3 | 24.7 | 23.3 | 24.3 | 23.9 | 12.0 | 12.0 | 11.3 | 13.0 | 12.1 |
| V4 | 22.0 | 23.3 | 22.0 | 22.8 | 22.5 | 11.5 | 11.8 | 11.0 | 12.0 | 11.6 |
| V5 | 23.8 | 24.7 | 23.6 | 24.8 | 24.2 | 12.4 | 12.2 | 11.8 | 12.8 | 12.3 |

We claim:

1. A support material for making color test prints in the analog proof system, comprising a paper support having a basis weight of between about 80–250 g/m². and a layer thereon comprising a binder or binder mixture which is hydrophobic and a pigment mixture containing hollow micro-balls having a diameter of 0.4 to 1 μm, said layer being receptive to color test printing directly on said microball containing layer to produce images of reduced optical dot gain.

2. A support material according to claim 1, wherein the hydrophobic binder is selected from the group consisting of acrylic acid ester, vinylacetate, vinylchloride/vinylacetate copolymer, polystyrene, polyurethane, polyvinylchloride, polyvinylidenechloride, styrene/butadiene copolymer and styrenated acrylic acid ester.

3. A support material according to claim 1, wherein the hollow micro-balls are polymer micro-balls of styrene/acrylate copolymer.

4. A support material according to claim 1, wherein the binder content of the layer is about 15 to 95% by weight.

5. A support material according to claim 4, wherein said binder content is about 20 to 80% by weight.

6. A support material to claim 5, wherein said binder content is about 20 to 50% by weight.

7. A support material according to claim 1, wherein the pigment mixture containing hollow micro-balls includes a pigment selected from the group consisting of $TiO_2$, $CaCO_3$, ZnO, ZnS, $ZnSO_4$, $Sb_2O_3$, $CaSO_4$, $BaSO_4$, kaolin, talcum and mixtures thereof.

8. A support material according to claim 7, wherein the $TiO_2$ content in the pigment mixture is about 10 to 80% by weight.

9. A support material according to claim 8, wherein said $TiO_2$ content is about 30 to 70% by weight.

10. A support material according to claim 1, wherein the content of the micro-balls in the pigment mixture is about 10 to 80% by weight.

11. A support material according to claim 10, wherein said content of micro-balls is about 30 to 70% by weight.

12. A support material according to claim 1, wherein the pigment content of the layer is about 5 to 85% by weight.

13. A support material according to claim 12, wherein said pigment content is about 50 to 80% by weight.

14. An analog proof system printing material comprising a support;
a layer on the support comprising a binder or binder mixture which is hydrophobic and a pigment mixture containing hollow micro-balls; and
a light sensitive color test printing layer laminated directly on said micro-ball containing layer.

15. A material according to claim 14, wherein said hollow micro-balls have a diameter of 0.4 to 1 μm.

16. A material according to claim 14, wherein the hydrophobic binder is selected from the group consisting of acrylic acid ester, vinylacetate, vinylchloride/vinylacetate copolymer, polystyrene, polyurethane, polyvinylchloride, polyvinylidenechloride, styrene/butadiene copolymer and styrenated acrylic acid ester.

17. A material according to claim 14, wherein the hollow micro-balls are polymer micro-balls of styrene/acrylate copolymer.

18. A material according to claim 14, wherein the binder content of the layer is about 15 to 95% by weight.

19. A material according to claim 18, wherein said binder content is about 20 to 80% by weight.

20. A material according to claim 19, wherein said binder content is about 20 to 50% by weight.

21. A material according to claim 14, wherein the pigment mixture containing hollow micro-balls includes a pigment selected form the group consisting of $TiO_2$, $CaCO_3$, $ZnO$, $ZnS$, $ZnSO_4$, $Sb_2O_3$, $CaSO_4$, $BaSO_4$, kaolin, talcum and mixtures thereof.

22. A material according to claim 21, wherein the $TiO_2$ content in the pigment mixture is about 10 to 80% by weight.

23. A material according to claim 22, wherein said $TiO_2$ content is about 30 to 70% by weight.

24. A material according to claim 14, wherein the content of the micro-balls in the pigment mixture is about 10 to 80% by weight.

25. A material according to claim 24, wherein said content of micro-balls is about 30 to 70% by weight.

26. A material according to claim 14, wherein the pigment content of the layer is about 5 to 85% by weight.

27. A material according to claim 26 wherein said pigment content is about 50 to 80% by weight.

28. The support material according to claim 14, wherein said support comprises a paper having a basis weight of between about 80–250 $g/m^2$.

* * * * *

UNITED STATES PATENT AND TRADEMARK OFFICE
CERTIFICATE OF CORRECTION

PATENT NO. : 5,858,603
DATED : January 12, 1999
INVENTOR(S) : Dieter Becker and Jurgen Graumann Page 1 of 1

It is certified that error appears in the above-identified patent and that said Letters Patent is hereby corrected as shown below:

Title page,
Attorney, Agent, or Firm, change "Fitz-Gibbon" to -- Fitz Gibbon --.

Column 2,
Line 32, delete "of".

Column 4,
Line 15, change "p laces" to -- places --.
Line 37, change "calculated" to -- calculated --.

Column 7,
Line 18, change "form" to -- from --.

Column 8,
Line 14, after "26" insert a comma -- , --.

Signed and Sealed this

Eleventh Day of December, 2001

*Attest:*

*Nicholas P. Godici*

*Attesting Officer*

NICHOLAS P. GODICI
*Acting Director of the United States Patent and Trademark Office*